US006388538B1

(12) United States Patent
Meier

(10) Patent No.: US 6,388,538 B1
(45) Date of Patent: May 14, 2002

(54) MICROWAVE COUPLING ELEMENT

(75) Inventor: Thomas Meier, Berlin (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/438,655

(22) Filed: Nov. 12, 1999

(30) Foreign Application Priority Data

Dec. 7, 1998 (DE) ........................................ 198 56 339

(51) Int. Cl.[7] .............................. H03H 5/00; H01P 5/12
(52) U.S. Cl. ..................................... 333/24 R; 333/116
(58) Field of Search ................................ 333/116, 112, 333/109, 115, 26, 204, 24 R

(56) References Cited

FOREIGN PATENT DOCUMENTS

JP 60229501 A * 11/1985 ................. 333/204

OTHER PUBLICATIONS

Otto Zinke and Anton Vlcek: "Lehrbuch Der Hochfrequenztechnik", 4., Neubearbeitete und Erweiterte Auflage Herausgegeben Von Otto Zinke Und Anton Vlcek, Erster Band, Hochfrequenzfilter, Leitungen, Antennen, Springer–Verlag Berlin, Heidel;Berg, New York, London, Paris, Tokyo, Hong Kong 1990, pp. 205–211.

* cited by examiner

*Primary Examiner*—Robert Pascal
*Assistant Examiner*—Kimberly E Glenn
(74) *Attorney, Agent, or Firm*—Michael J. Striker

(57) ABSTRACT

A microwave coupling element for coupling an input conductor with an output conductor exhibiting a predetermined wave propagation resistance includes a coupling portion interposed between the input and output conductors and including two parallel strip conductors that are galvanically uncoupled from one another. The strip conductors are spaced from each other by a predetermined distance and each has a predetermined width, at least one of the predetermined width and the predetermined distance being up to twice as large as that which would correspond to a minimum mismatch with the input and output connectors. The resulting mismatch is compensated for by at least one transformation connector exhibiting a wave propagation resistance smaller than the predetermined wave propagation resistance.

11 Claims, 3 Drawing Sheets

MICROWAVE COUPLING ELEMENT

BACKGROUND OF THE INVENTION

1. Field of the Invention

The present invention relates microwave transmission in general, and more particularly to coupling elements to be used for coupling between respective microwave input and output conductors.

2. Description of the Related Art

There are already known various constructions of coupling elements to be interposed into microwave transmission lines, among them such that are widely used in the field of microwave technology and extensively described in the literature relating thereto and that combine the functions of a coupler with that of a bandpass filter by utilizing a pair of cooperating strip conductors in the respective coupling element. The typical strip conductor coupling element of this kind includes two parallel strip conductors that are galvanically uncoupled from each other and each of which has a length of λ/4, wherein λ is the effective nominal frequency of the microwaves that are to be transmitted through the coupling element. By resorting to the use of the Richard Transformation, which is described, for instance, in the book authored by Zinke and Brunswig and entitled "Lehrbuch der Hochfrequenztechnik", 1990, pages 206 to 211, such coupled λ/4 conductors can be described by an equivalent circuit which includes a λ/4 coaxial conductor with a wave propagation resistance of $Z_L$ connected between two capacitors. An ideal capacitive coupling element with minimum insertion loss can be provided if the wave propagation resistance $Z_L$ of the conductor in the equivalent circuit matches the wave propagation resistance in the two connected conductors to be coupled by the coupling element, in most instances 50Ω. The matching of the wave propagation resistance of the coupling element is accomplished by appropriately choosing the width and mutual distance of the parallel strip conductors of the coupling element. Using the assumed input and output conductor wave propagation resistance of 50Ω and contemplating the use of the coupling element in a radar frequency range of approximately 24 Ghz, then, for use with a microwave substrate with a dielectric constant $\epsilon_r$=3.0 and a thickness of 250 μm, there are required microstrip conductors with a width of about 90 μm and a distance from one another of about 60 μm. Yet, the production of strip conductors of these widths and mutual distances using the relatively inexpensive standard conductor plate technology is problematical at the very least.

OBJECTS OF THE INVENTION

Accordingly, it is a general object of the present invention to avoid the disadvantages of the prior art.

More particularly, it is an object of the present invention to provide a microwave coupling element that does not possess the drawbacks of the known coupling elements of this type.

Still another object of the present invention is to devise a microwave coupling element of the type here under consideration which has an insertion loss comparable with if not superior to that of the conventional coupling elements of this kind and, moreover, an improved frequency response, especially a highly selective bandpass characteristic.

It is yet another object of the present invention to design the above coupling element in such a manner as to be able to manufacture the same by resorting to the use or relatively inexpensive standard manufacturing techniques.

A concomitant object of the present invention is so to construct the microwave coupling element of the above type as to be relatively simple in construction, inexpensive to manufacture, easy to use, and yet reliable in operation.

SUMMARY OF THE INVENTION

In keeping with the above objects and others which will become apparent hereafter, one feature of the present invention resides in a microwave coupling element for coupling an input conductor with an output conductor each exhibiting a predetermined wave propagation resistance. According to the invention, this coupling element includes a coupling portion interposed between the input and output conductors and including two parallel strip conductors and means for galvanically uncoupling the strip conductors from one another. The strip conductors of the coupling portion are spaced from each other by a predetermined distance and each has a predetermined width, at least one of the predetermined width and the predetermined distance being up to twice as large as that which would correspond to a minimum mismatch with the input and output connectors. Last but not least, the coupling element of the present invention includes means for compensating for the resulting mismatch, including at least one transformation connector exhibiting a wave propagation resistance smaller than the predetermined wave propagation resistance of the input and output conductors.

A particular advantage of the microwave coupling element of the present invention as described so far is that the strip conductors of the coupling portion can now be manufactured, owing to their relatively larger widths and/or spacing, by using standard conductor plate or integrated board manufacturing techniques rather then specialized, intricate and hence expensive procedures. As a result, there can be produced a relatively inexpensive microwave coupling element for use in the radar frequency range, above all for the mass production for instance in the motor vehicle manufacturing field. Yet, by proposing the use of at least one transformation conductor, the present invention avoids the mismatch and too high a wave propagation resistance, and with them the attendant increased insertion loss that would otherwise exist in reality and/or in the aforementioned equivalent circuit at these strip conductor widths and/or spacing.

According to an advantageous aspect of the present invention, there is further provided an additional transformation conductor similar to the one transformation conductor, the one and the additional transformation conductor being arranged between the input and output conductors, respectively, and the coupling portion. The use of such two transformation conductors has the advantage that, for the compensation of a certain higher coupling portion wave propagation resistance, a transformation conductor wave propagation resistance that is not all that small is sufficient for each of the two transformation conductors, so that a smaller width of the transformation conductor suffices. The advantageous width of a strip conductor is limited in the upward direction by transverse resonance effects and the like.

Advantageously, the two transformation conductors have a length of between one-fourth and one-eighth of the nominal wavelength of the coupling element. This length range constitutes an advantageous compromise between the overall length of the structural component, which should be as small as possible, and the electrical parameters that should be as close to ideal as possible.

When the coupling element of the present invention is to be used with input and output conductors with the predetermined wave propagation resistance amounting to 50Ω, it is advantageous when the wave propagation resistance of each of the transformation conductors is between 30 and 40Ω, preferably at about 35Ω.

According to another facet of the present invention, just one transformation conductor of the above kind is being used. In this instance, the transformation conductor advantageously has a length of about one-fourth of the nominal wavelength of the coupling element and the wave propagation resistance thereof is about a half of the predetermined wave propagation resistance. This implementation of the coupling element of the present invention has the advantage of a very short length of the overall coupling component.

The parallel strip conductors of the coupling portion advantageously have a length corresponding to one-fourth of the nominal wavelength of the coupling element. The predetermined width of each of the parallel strip conductors of the coupling portion advantageously is between 150 to 250 μm, while the predetermined distance between the parallel strip conductors of the coupling portion advantageously lies between 100 and 200 μm. Such dimensions can be easily produced in a relatively inexpensive manner by using standard integrated circuit board or conductor plate fabrication techniques.

Advantageously, the insertion loss at the nominal frequency of the coupling element is less than 1 dB. Moreover, the coupling element of the present invention advantageously exhibits a bandpass frequency response. What is especially desirable and achieved by the present invention is for the coupling element to exhibit a pronounced stop band attenuation of frequencies that are low with respect to the nominal frequency of the coupling element.

The microwave coupling element of the present invention further has the advantage that, as a result of the increased distance between the two strip conductors of the coupling portion, the resistance to dielectric breakdown is increased as well.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawing.

DETAILED DESCRIPTION OF THE PREFERRED EMBODIMENT

Figure 1:
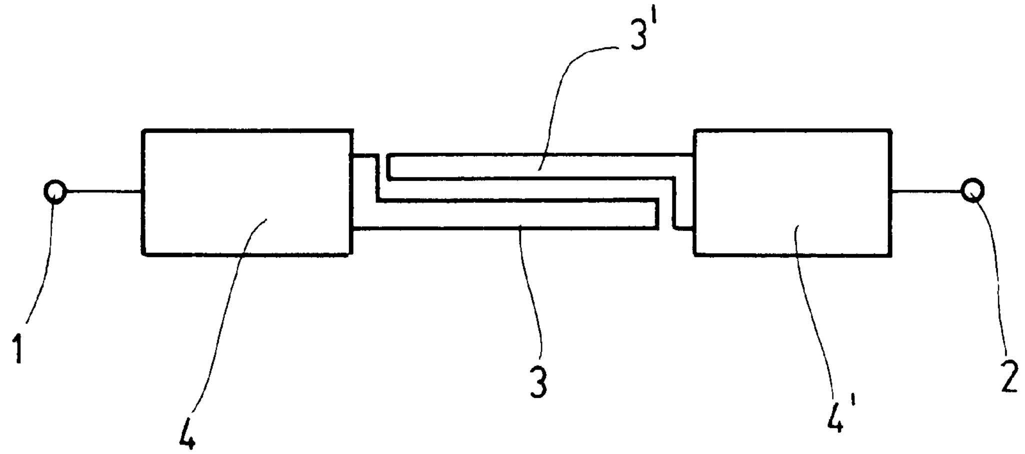
FIG. 1 is a simplified side elevational view of a microwave coupling element constructed in accordance with the present invention.

Referring now to the drawing in detail, and first to FIG. 1 thereof, it may be seen that the reference numerals 1 and 2 have been used therein to identify a first conductor and a second conductor, respectively, to be coupled with one another, of which each has been indicated only diagrammatically. Each of the conductors 1 and 2 has, as is customary, a predetermined conductor resistance $R_L$, such as for instance 50Ω, to the propagation of microwaves therein. Based on a direction of microwave propagation of that has been arbitrarily chosen for the purposes of the present description at least as far as the construction revealed in FIG. 1 is concerned, the conductors 1 and 2 will be referred to herein as input and output conductors, respectively. A microwave coupling element embodying the present invention, which will be described in more detail presently and which is shown in the drawing in a somewhat a simplified diagrammatic fashion as well, is situated between the input conductor 1 and the output conductor 2.

A coupling portion including two parallel microstrip conductors 3 and 3' that are galvanically uncoupled from each other is arranged at the central region of the coupling element. The width of the microstrip conductors 3 and 3', which are carried on a substrate with a dielectric constant εhd r=3.0 and a thickness of, for example, 250 μm is between 100 μm and 200 μm, and the distance of these microstrip conductors 3 and 3' from each other amounts to between 150 μm and 250 μm. As a result of these excessive dimensions as compared to those used in accordance with the state of the art, an undesirable impedance transformation would typically take place in the coupling element of this construction. Without any additional measures, this impedance transformation would then result in increases in the input and output reflection factors and, consequently, in an increase in matching error losses.

In order to compensate for this effect, it is proposed in accordance with the present invention to provide two transformation conductors 4 and 4' the wave propagation resistance of which is smaller than that of the input and output conductors 1 and 2. So, for instance, when the wave propagation resistance of the input and output conductors 1 and 2 is 50Ω as postulated above, the wave propagation resistance of the transformation conductors 4 and 4' lies preferably between 30 and 40Ω, preferably at about 35Ω. The microwave coupling element according to the present invention as illustrated in FIG. 1 of the drawing has a very low insertion loss or attenuation at the region of the nominal frequency of the coupling element (that is the frequency corresponding to the effective wavelength equaling four times the length of the microstrip conductors 3 and 3') and exhibits a pronounced stop band attenuation at the region of lower frequencies.

When selecting the dimensions of the transformation conductors 4 and 4', both the maximum possible structural width of the microstrip conductors, which is limited by resonance effects, and the desirable compact construction of the entire structural component, which is to be as short as possible, are to be taken into consideration. A length of the transformation conductors 4 and 4' lying in the range of between and λ/8, especially at about 0.65 times λ/4, has been found to be particularly advantageous.

Figure 2:
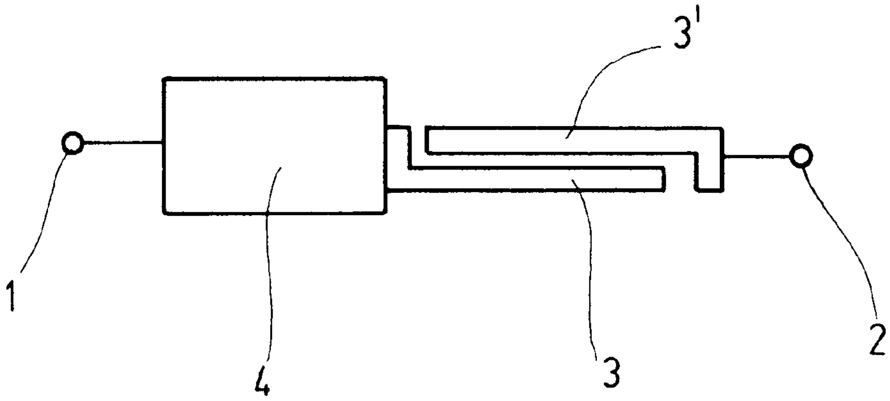
FIG. 2 is a view similar to that of FIG. 1 but showing a modified construction of the microwave coupling element of the present invention.

FIG. 2 shows a construction of the microwave coupling element of the present invention which has so many features common with the one described above that the same reference numerals as before have been used to identify corresponding parts. Yet, this construction is structurally different from that illustrated in FIG. 1 in that it includes just one transformation conductor 4. As a result, this modified construction renders it possible to achieve particularly compact structural component dimensions.

Figure 3:
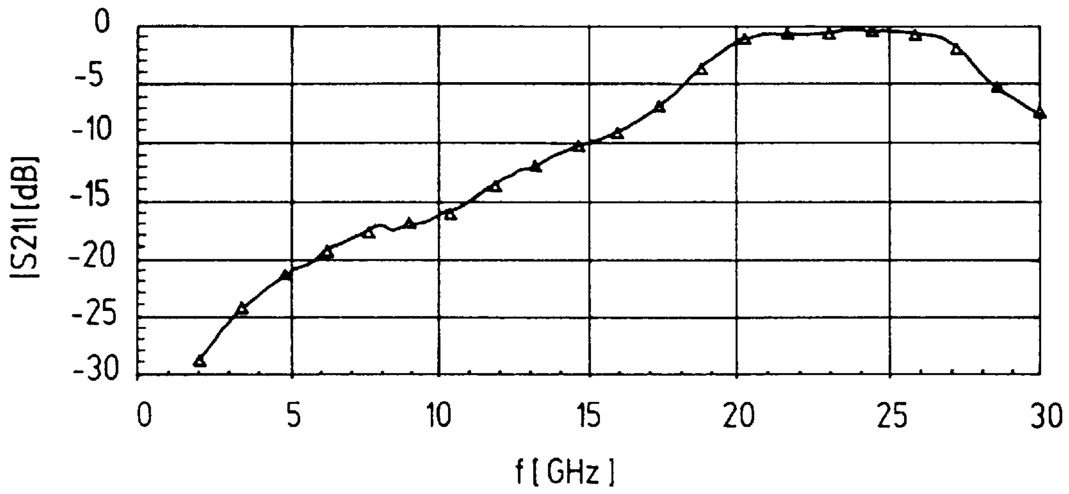
FIG. 3 is a graphic representation of an actual measured frequency response of a microwave coupling element of the present invention.

FIG. 3 of the drawing reveals the measured frequency response of an actual testing embodiment of the microwave coupling element of the present invention. The nominal frequency is at about 24 GHz. As can be ascertained from FIG. 3, the coupling element exhibits a pronounced band-pass characteristic with a relatively wide pass maximum in the range between 21 and 27 Ghz. Towards the lower frequencies, there appears a pronounced stop band attenuation characteristic, which is a desirable phenomenon in that it leads to suppression of high-frequency noise signals that stem from digital control signals and their harmonics.

Figure 4:
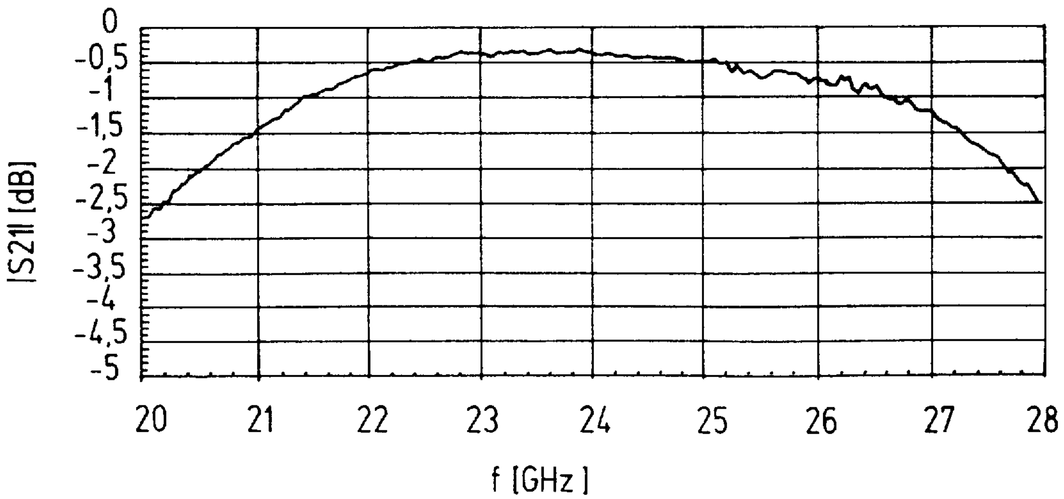
FIG. 4 is a view akin to that of FIG. 3 but showing merely a portion of the latter on a scale enlarged relative thereto.

FIG. 4 shows, at an enlarged scale, the frequency range between 20 and 28 Ghz. It can be seen there that the insertion attenuation or loss in the vicinity of the nominal frequency of 24 Ghz is less than about 0.5 dB.

Figure 5:
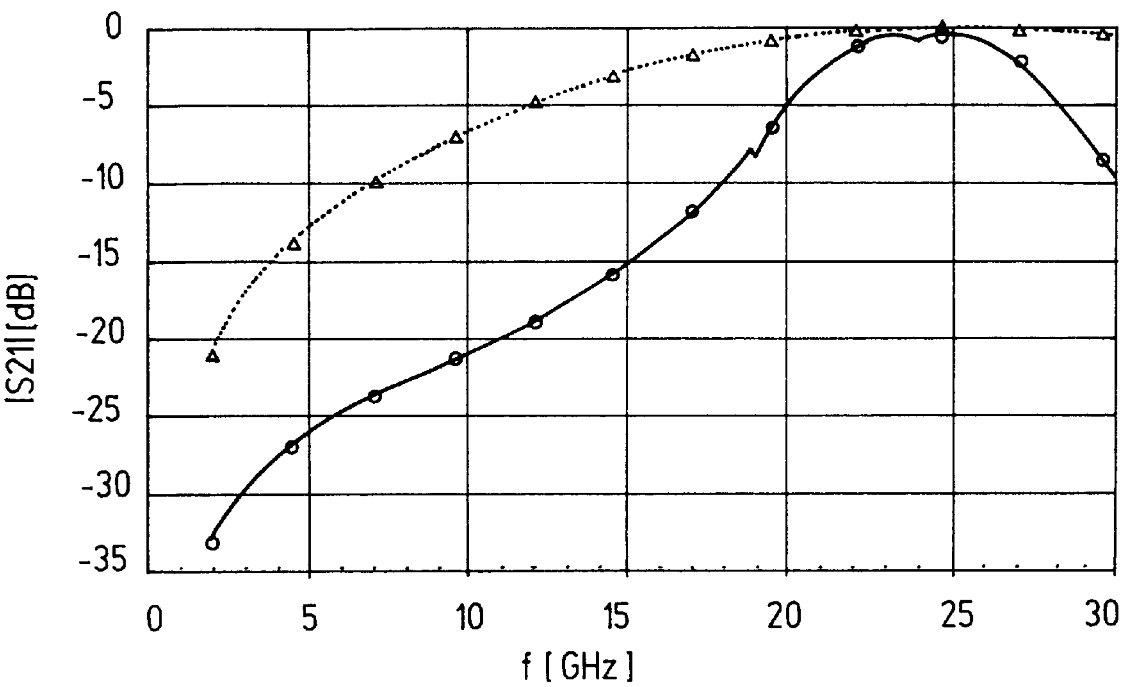
FIG. 5 is a graphic representation corresponding to that of FIG. 3 but showing a calculated frequency response of a microwave coupling element of the present invention in comparison to that of a conventional element of a comparable type.

FIG. 5 is a graph representing, by a solid line embellished by circular symbols, the simulated frequency response of a microwave coupling element of the present invention with a coupling portion the microstrip connectors 3 and 3' have a length of 2.5 millimeters, a width of 0.1 millimeter, and a distance from one another of 0.24 millimeters. The bandpass characteristic of this coupling element is once more clearly recognizable. On the other hand, a dotted line accompanied by triangular symbols represents a reference example of a conventionally constructed coupling element without any transformation conductor, with microstrip conductors each having a length of 2.5 millimeters and a width of 0.1 millimeters, which are located at a distance of 0.06 millimeters from each other. One may observe in the drawing the considerably flatter frequency response as compared to that obtained in the construction provided in accordance with the present invention.

Figure 6:
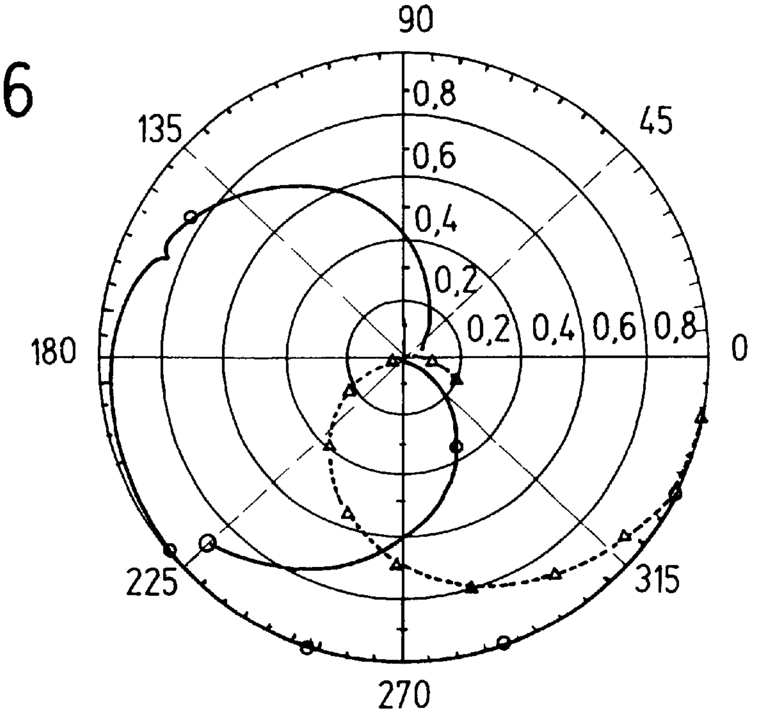
FIG. 6 is a graph depicting the complex reflection factor of the microwave coupling element of the present invention with the frequency response presented in FIG. 5.

In FIG. 6 there are presented simulations of the complex reflection factor for the two coupling elements that have been defined above in conjunction with and the characteristic responses of which have been presented in FIG. 5. Here again, the behavior of the coupling element constructed in accordance with the present invention is represented by a solid line carrying circular symbols, while that of the conventional coupling element construction is represented by a dotted line interconnecting respective triangular symbols. Both of these curves run in the clockwise direction, that is they commence at 1 in the proximity of 360° at the idle point. While the curve representative of the locus of frequency response points for the conventionally dimensioned microwave coupling element (dotted) runs uniformly inwardly, the curve corresponding to the locus of frequency response points for the microwave coupling element dimensioned and enhanced in accordance with the present invention (solid) runs longer along the outer periphery, then quickly (within two marker points) passes toward the middle of the graph. After the passage of a point close to zero at the region of the nominal frequency of 24 GHz, the solid curve reverses its course to run again toward the outer periphery; this reveals once more the bandpass characteristic of the coupling element of the present invention that was already apparent in FIG. 5 of the drawing.

The construction of the microwave coupling element as proposed by the present invention renders it possible to achieve advantageous electric characteristics by using structural dimensions that are relatively large, and hence can be fabricated relatively inexpensively.

It will be understood that each of the elements described above, or two or more together, may also find a useful application in other types of constructions differing from the type described above.

While the present invention has been described and illustrated herein as embodied in a specific construction of a microwave coupling element, it is not limited to the details of this particular construction, since various modifications and structural changes may be made without departing from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

I claim:

1. A microwave coupling element for coupling an in put conductor with an output conductor each exhibiting a predetermined wave propagation resistance, comprising a coupling portion interposed between the input and output conductors and including two parallel strip conductors and means for galvanically uncoupling said strip conductors from one another, wherein said coupling portion exhibits a bandpass frequency response, said strip conductors being spaced from each other by a predetermined distance and each having a predetermined width, at least one of said predetermined width and said predetermined distance being up to twice as large as that which would correspond to a minimum mismatch with the input and output connectors; and means for compensating for the resulting mismatch, including at least one transformation connector exhibiting a wave propagation resistance smaller than the predetermined wave propagation resistance.

2. The microwave coupling element as defined in claim 1; and further comprising an additional transformation conductor similar to said one transformation conductor, said one and said additional transformation conductor being arranged between the input and output conductors, respectively, and said coupling portion.

3. The microwave coupling element as defined in claim 2, wherein said two transformation conductors have a length of between one-fourth and one-eighth of the nominal wavelength of the coupling element.

4. The microwave coupling element as defined in claim 2 for use with input and output conductors with the predetermined wave propagation resistance amounting to 50Ω, wherein said wave propagation resistance of each of said transformation conductors is between 30 and 40Ω.

5. The microwave coupling element as defined in claim 4, wherein said wave propagation resistance of each of said transformation conductors is 35Ω.

6. The microwave coupling element as defined in claim 1, wherein said transformation conductor has a length of about one-fourth of the nominal wavelength of the coupling element and said wave propagation resistance thereof is about a half of the predetermined wave propagation resistance.

7. The microwave coupling element as defined in claim 1, wherein said parallel strip conductors of said coupling portion have a length corresponding to one-fourth of the nominal wavelength of the coupling element.

8. The microwave coupling element as defined in claim 1, wherein said predetermined width of each of said parallel strip conductors of said coupling portion is between 150 to 250 $\mu$m.

9. The microwave coupling element as defined in claim 1, wherein said predetermined distance between said parallel strip conductors of said coupling portion is between 100 and 200 μm.

10. The microwave coupling element as defined in claim 1, wherein the insertion loss at the nominal frequency of the coupling element is less than a decibel.

11. The microwave coupling element as defined in claim 1, wherein the coupling portion exhibits a pronounced stop band attenuation of frequencies that are low with respect to the nominal frequency of the coupling element.

* * * * *